(12) United States Patent
Saito et al.

(10) Patent No.: US 9,955,585 B2
(45) Date of Patent: Apr. 24, 2018

(54) CONDUCTIVE PATTERN PRODUCTION DEVICE

(71) Applicant: Konica Minolta, Inc., Chiyoda-ku, Tokyo (JP)

(72) Inventors: Keita Saito, Toyokawa (JP); Midori Shimomura, Hino (JP); Dai Suwama, Hachioji (JP); Sayaka Morita, Gamagori (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 2 days.

(21) Appl. No.: 14/801,137

(22) Filed: Jul. 16, 2015

(65) Prior Publication Data

US 2016/0027557 A1    Jan. 28, 2016

(30) Foreign Application Priority Data

Jul. 23, 2014 (JP) ................. 2014-149330

(51) Int. Cl.
| | | |
|---|---|---|
| H01B 13/00 | (2006.01) | |
| H05K 3/12 | (2006.01) | |
| B05C 5/02 | (2006.01) | |
| H05K 1/09 | (2006.01) | |

(52) U.S. Cl.
CPC ......... *H05K 3/1283* (2013.01); *B05C 5/0204* (2013.01); *H01B 13/0026* (2013.01); *H05K 1/097* (2013.01); *H05K 2201/0145* (2013.01); *H05K 2201/083* (2013.01); *H05K 2203/102* (2013.01); *H05K 2203/1131* (2013.01); *H05K 2203/1545* (2013.01)

(58) Field of Classification Search
None
See application file for complete search history.

(56) References Cited

U.S. PATENT DOCUMENTS

| | | | |
|---|---|---|---|
| 6,602,446 B2 | 8/2003 | Ushijima | |
| 8,827,435 B2 * | 9/2014 | Uematsu | C09D 7/1266 347/100 |

FOREIGN PATENT DOCUMENTS

| | | |
|---|---|---|
| JP | 2001-156414 A | 6/2001 |
| JP | 2002-198656 A | 7/2002 |
| JP | 2009-529151 A | 8/2009 |
| JP | 2010-239149 A | 10/2010 |
| JP | 2013-120864 A | 6/2013 |
| JP | 2013-159753 A | 8/2013 |
| WO | WO 2007-103265 A2 | 9/2007 |

OTHER PUBLICATIONS

Notification of Reasons for Refusal dated Oct. 27, 2016, by the Japanese Patent Office in corresponding Japanese Patent Appln. No. 2014-149330, with partial English translation of the Notification (9 pages).

* cited by examiner

Primary Examiner — Jethro M Pence
(74) Attorney, Agent, or Firm — Buchanan Ingersoll & Rooney PC

(57) ABSTRACT

A conductive pattern production device includes: a patterning unit that forms a pattern of a composite ink on a base member; and a burning unit that burns the pattern by high-frequency heating. The composite ink is obtained by mixing a particle material that is a material having a relative permeability of 200 or above or a carbon micro-coil and a conductive ink that has, after the burning, a resistivity of 1 to 2000 µΩ·cm.

9 Claims, 2 Drawing Sheets

CONDUCTIVE PATTERN PRODUCTION DEVICE

This application is based on Japanese Patent Application No. 2014-149330 filed on Jul. 23, 2014, the contents of which are hereby incorporated by reference.

BACKGROUND OF THE INVENTION

Field of the Invention

The present invention relates to a conductive pattern production device that produces a conductive pattern.

Description of the Related Art

Conventionally, as a method of producing a conductive pattern on a base member by application of printing technology, printed electronics (PE) is utilized. As one form of such a method, there is a method of utilizing high-frequency heating.

For example, Japanese Unexamined Patent Application Publication No. 2013-120864 discloses a product that microwave-burns a conductive pattern on a porous base member to reduce voids produced within the conductive pattern. Here, examples of the conductive pattern include a metal ink.

Japanese Unexamined Patent Application Publication (Translation of PCT Application) No. 2009-529151 discloses microwave-burning as one metal film curing method when a metal film is produced under atmospheric pressure within an electrochromic device or an electro-optical device. Here, examples of the metal film include a metal ink.

With respect to high-frequency heating on a conductive nanoink, since conductive nanoparticles contained in the conductive nanoink generate heat only by eddy current loss caused by a high-frequency magnetic field, its heat generation efficiency is low, with the result that there is a problem in terms of energy efficiency. Although patent documents 1 and 2 described above disclose various types of metals as a target of microwave heating, they neither disclose nor suggest the enhancement of absorption efficiency by high-frequency heating.

In view of the foregoing problem, the present invention has an object to provide a conductive pattern production device that can enhance the energy efficiency of burning by high-frequency heating.

SUMMARY OF THE INVENTION

A conductive pattern production device according to the present invention includes: a patterning unit that forms a pattern of a composite ink on a base member; and a burning unit that burns the pattern by high-frequency heating, where the composite ink is obtained by mixing a particle material that is a material having a relative permeability of 200 or above or a carbon micro-coil and a conductive ink that has, after the burning, a resistivity of 1 to 2000 $\mu\Omega \cdot cm$. With this configuration, it is possible to enhance the energy efficiency of burning by high-frequency heating.

In the configuration described above, more specifically, the patterning unit may form, as the pattern of the composite ink, a pattern in which the particle material and the conductive ink are stacked in layers.

In the configuration described above, the patterning unit may include: a first patterning unit that applies the particle material onto the base member; and a second patterning unit that applies the conductive ink onto the applied particle material.

In the configuration described above, more specifically, the particle material may be a carbon micro-coil or may be any of Ni, Co, Fe and Gd.

DESCRIPTION OF PREFERRED EMBODIMENTS

Embodiments of the present invention will be described below with reference to drawings, using a first embodiment and a second embodiment as examples. The present invention is not limited at all to these embodiments.

1. First Embodiment

Figure 1:
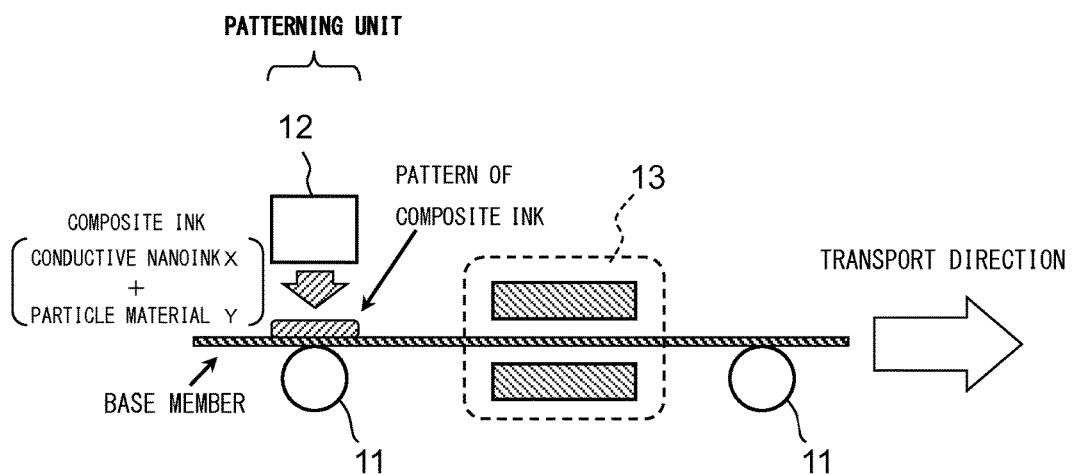
FIG. 1 A diagram schematically showing the configuration of a conductive pattern production device according to a first embodiment.

The first embodiment will first be described. FIG. 1 is a diagram schematically showing the configuration of a conductive pattern production device 1 according to the first embodiment. As shown in the figure, the conductive pattern production device 1 includes a transport unit 11, a patterning unit 12 and a burning unit 13. The conductive pattern production device 1 is a device that forms a pattern of a composite ink on a base member to produce a conductive pattern by high-frequency heating.

The transport unit 11 is a unit that transports the base member from the left side (upstream side) to the right side (downstream side) in FIG. 1, and for example, the transport unit 11 is configured to transport the base member by the utilization of the rotation of a roller. The form of the transport unit 11 is not particularly limited, and for example, a form of using a transport belt member may be adopted or a form of transporting the base member manually by an operator may be adopted.

With respect to the base member, the material and size thereof can be selected according to the intended use and the like. With respect to the material, for example, when it is desired to acquire transparency, a resin material such as PET is preferably used, when it is desired to acquire elasticity, an elastic material such as a silicone rubber sheet is preferably used or when it is desired to acquire heat resistance, a glass base material or the like is preferably used. Depending on the intended use and the like, various types of materials other than the materials described above can be adopted. With respect to the size of the base member, for example, when one sheet is used for one item, the base member of necessary size is preferably used or a method of cutting the base member into a necessary size in the subsequent step may be adopted.

The patterning unit 12 is a unit that forms a pattern of a composite ink on the base member. The composite ink is obtained by mixing a conductive nanoink X and a particle material Y. As will be more obvious from the following description, in the composite ink of the first embodiment, the conductive nanoink X and the particle material Y are previously mixed whereas in the composite ink of the second embodiment, the conductive nanoink X and the particle material Y are mixed so as to be stacked in layers.

The conductive nanoink X is a conductive ink (where conductive particles are dispersed) in which conductive nanoparticles are dispersed and whose resistivity after burning is 1 to 2000 μΩ·cm. The type of conductive nanoink X can be selected according to the intended use and the like.

For example, when a conductive pattern having a low resistivity (in a range of 1 to 1000 μΩ·cm) is produced, a metal ink in which metal particles are dispersed is preferably used. Examples of the type of metal described above include Au, Ag, Cu and the nanowires thereof. When a conductive pattern having a high resistivity (1000 μΩ·cm or above) is produced, examples of the type of material contained in the conductive nanoink X include a CNT (carbon nanotube) and a conductive polymer material.

On the other hand, the particle material Y is a particle material that has higher absorption efficiency in high-frequency heating than the conductive nanoink X (for example, that has higher absorption efficiency in a magnetic field used in high-frequency heating). Examples of the type of the particle material Y used include ferromagnetic materials such as Ni, Co, Fe and Gd so that eddy current loss and hysteresis loss are more likely to be induced (the relative permeability thereof is 250 or above, and is preferably 1000 or above). Any of Ni, Co, Fe and Gd is a material that has a relative permeability of 200 or above.

As the type of particle material Y, a CMC (carbon micro-coil) in which dielectric loss, eddy current loss or hysteresis loss is more likely to be induced by an asymmetric structure can also be used. The CMC is an amorphous carbon fiber that is wound into a coil with a pitch of the order of microns.

The patterning unit 12 can form, on the base member, the pattern of a composite ink in which the conductive nanoink X and the particle material Y are previously mixed so as to have an arbitrary shape. A mixed rate of the conductive nanoink X and the particle material Y is preferably 0.1 to 10 v %. When the mixed rate is lower than the lower limit (0.1 v %), in high-frequency heating, insufficient heat is more likely to be generated. By contrast, when the mixed rate is higher than the upper limit (10 v %), there is a possibility that in high-frequency heating, excessive heat is generated, the effect is saturated, it is difficult to control time in which heat is generated and the resistivity is degraded.

Examples of the method of forming the pattern with the patterning unit 12 include various types of non-plate printing methods such as an inkjet method, an wet electrophotography method and a method of using a dispenser and various types of plate printing methods such as screen printing, gravure printing and flexographic printing. However, it is necessary to select an application and a conductive nanoink X suitable for each application method.

For example, when the conductive nanoink X is applied with the inkjet method, it is necessary that the viscosity of the ink be adjusted to be about 3 to 15 mPa·sec and that the surface tension be adjusted to be about 26 to 40 mN/m. With respect to the application, for example, the inkjet method is not suitable for a wiring application in which a certain amount of thickness is needed, and screen printing or the like is preferably used.

The burning unit 13 is provided on the downstream side with respect to the patterning unit 12, has the function of outputting high-frequency waves and performs high-frequency heating on the pattern of the composite ink formed by the patterning unit 12. When the pattern of the composite ink on the base member is burned by high-frequency heating, the conductive pattern is produced.

When the burning unit 13 uses, for example, electromagnetic waves of 300 MHz to 300 GHz, as a generation source of the electromagnetic waves, magnetron, klystron or gyrotron is applied. As the frequency band used, 2.45 GHz is preferable.

When the particle material Y having a particle diameter of the order of microns to millimeters is used, as the burning unit 13, an IH heater that generates a high-frequency magnetic field of 1 kHz to 1 MHz can also be used. In terms of the conductivity and the resolution of the pattern, the particle material Y having a particle diameter of the order of nanometers is preferably used. Preferably, a criterion of determination of the completion of the burning by the burning unit 13 is, for example, that the resistivity falls within a practical range. In the present embodiment, as an example, it is determined that the burning is completed when the resistivity reaches twice the resistivity of the particles contained in the composite ink and in a bulk state.

[Results of Evaluation]

In order to evaluate the conductive pattern production device 1 described above, under the conditions of examples 1 and 2 indicated blow, a burning time (high-frequency heating time necessary to achieve a constant resistivity) was measured. Under conditions of comparative example 1 indicated below, a burning time was also measured, and the results thereof were used to perform comparative evaluation.

The conditions of example 1 were first set as follows.

Conductive nanoink X: Ag nanoink (Harima Chemicals Inc., NPS-JL)
Particle material Y: Fe nanoink (Tateyama Machine Co., Ltd., metal particle dispersion liquid)
Patterning unit: inkjet (inkjet head, Konica Minolta, Inc., KM512)
Base member: PET sheet (LMS)
Burning unit: microwave heating device (Fuji Electronic Industrial Co., Ltd. FDU-102VP-02)
Mixed rate of the particle material Y: 4, 7, 10 v %
Pattern of a composite ink: straight line having a width of 500 μm and a length of 5 cm The conditions of example 2 were the same as those of example 1 except that the type of particle material Y was a CMC addition paste (CMC Technology Development Co., Ltd.). The conditions of comparative example 1 were the same as those of example 1 except that the particle material Y was not mixed (the mixed rate of the particle material Y was set at 0 v %).

The burning time was assumed to be the heating time until the resistivity of the conductive pattern reached 40 μΩ·cm. The resistivity was measured with a digital multimeter PC20 made by Sanwa Electric Instrument Co., Ltd. under conditions in which a terminal-to-terminal distance was set at 1 cm. In the production of the composite ink of example 1, the solvent of the Fe nanoink was previously volatilized by heat such that Fe was prevented from being aggregated, and it was mixed with the Ag nanoink.

Figure 2:
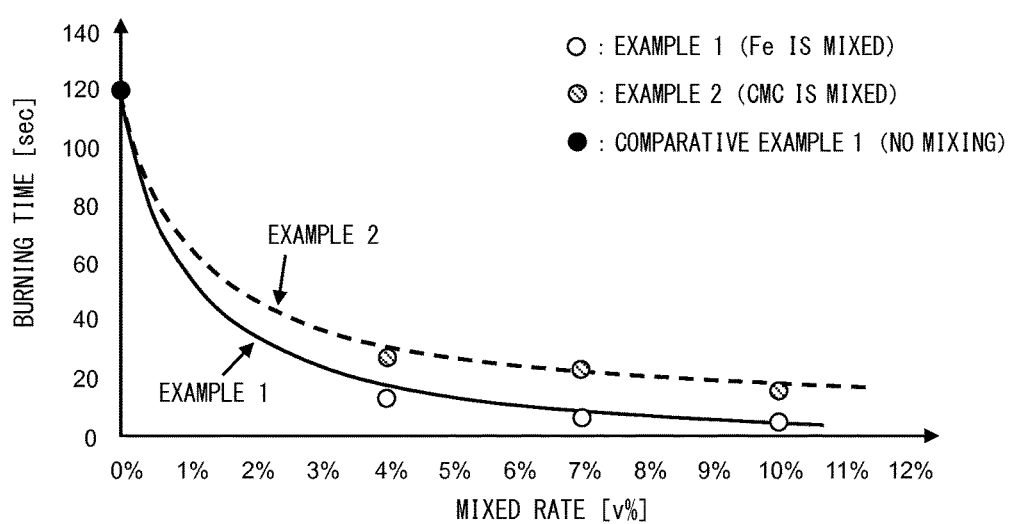
FIG. 2 A graph on the results of evaluation in the first embodiment.

FIG. 2 is a graph showing the results of the evaluation on examples 1 and 2 and comparative example 1, and the horizontal axis represents the mixed rate of the particle material Y and the vertical axis represents the burning time. Table 1 shows, among the data of the graph shown in FIG. 2, data when the mixed rate of the particle material Y was 0 v % and when the mixed rate of the particle material Y was 10 v %.

TABLE 1

|  | Example 1 | Example 2 | Comparative example 1 |
|---|---|---|---|
| Mixed rate [v %] of particle material Y | 10 | 10 | 0 |
| Burning time [sec] | 3 | 15 | 120 |

As shown in FIG. 2 and table 1, it was confirmed that in each of examples 1 and 2, as compared with comparative example 1, the burning time was short. In other words, it was found that when the conductive nanoink X (the Ag nanoink) and the particle material Y (the Fe nanoink or the CMC addition paste) were mixed, as compared with a case where they were not mixed, the burning time was short.

2. Second Embodiment

A second embodiment will then be described. The second embodiment is basically the same as the first embodiment except the form of the patterning unit. In the following description, attention is focused on the description of points different from the first embodiment, and the description of common points may be omitted.

Figure 3:
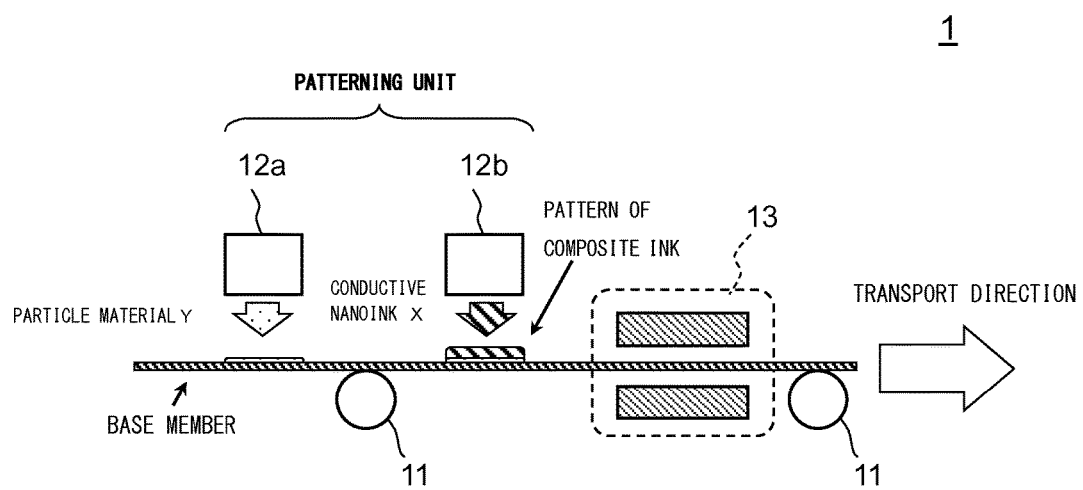
FIG. 3 A diagram schematically showing the configuration of a conductive pattern production device according to a second embodiment.

FIG. 3 is a diagram schematically showing the configuration of a conductive pattern production device according to the second embodiment. As shown in the figure, the conductive pattern production device 1 includes, as the patterning unit for forming the pattern of the composite ink, a first patterning unit 12a and a second patterning unit 12b.

In the second embodiment, instead of using the composite ink in which the conductive nanoink X and the particle material Y are previously mixed, the conductive nanoink X and the particle material Y are separately applied. Specifically, the second patterning unit 12b is arranged on the downstream side with respect to the first patterning unit 12a. The first patterning unit 12a first applies the particle material Y onto the base member, and thereafter the second patterning unit 12b applies the conductive nanoink X onto the applied particle material Y.

In this way, as the pattern of the composite ink, a pattern in which the particle material Y and the conductive nanoink X are stacked in layers is formed. The second patterning unit 12b is preferably a unit that uses a method (preferably, a non-contact inkjet method) of preventing the pattern on the base member from being disturbed. When a contact-type unit is used, a needle-type dispenser or the like that has a small contact area with the pattern applied by the first patterning unit 12a can be used as the second patterning unit 12b.

[Results of Evaluation]

In order to evaluate the conductive pattern production device 1 according to the second embodiment, under the conditions of example 3 indicated blow, a burning time (high-frequency heating time necessary to achieve a constant resistivity) was measured. Under conditions of comparative examples 2 and 3 indicated below, a burning time was also measured, and the results thereof were used to perform comparative evaluation.

The conditions of example 3 were first set as follows.
Conductive nanoink X: Ag nanoink (Harima Chemicals Inc., NPS-JL)
Particle material Y: Fe nanoink (Tateyama Machine Co., Ltd., metal particle dispersion liquid)
First patterning unit <unit for applying the particle material Y>: inkjet (inkjet head, Konica Minolta, Inc., KM512)
Second patterning unit <unit for applying the conductive nanoink X>: inkjet (inkjet head, Konica Minolta, Inc., KM512)
Base member: PET sheet (LMS)
Burning unit: microwave heating device (Fuji Electronic Industrial Co., Ltd. FDU-102VP-02)
Mixed rate of the particle material Y: 10 v %
Pattern of the particle material Y and the conductive nanoink X: straight line having a width of 500 μm and a length of 5 cm The conditions of comparative example 2 were the same as those of example 3 except that as in the first embodiment, the composite ink in which the conductive nanoink X and the particle material Y were previously mixed was used. The conditions of comparative example 3 were the same as those of example 3 except that the first patterning unit was used as the unit for applying the conductive nanoink X and the second patterning unit was used as the unit for applying the particle material Y.

The burning time was assumed to be the heating time until the resistivity of the conductive pattern reached 20 or 40 μΩ·cm. The resistivity was measured with the digital multimeter PC20 made by Sanwa Electric Instrument Co., Ltd. under conditions in which a terminal-to-terminal distance was set at 1 cm.

Table 2 is a table showing the results of the evaluation on example 3, comparative example 2 and comparative example 3. When as in example 3, the Ag nanoink was applied onto the pattern of the Fe nanoink formed by the first patterning unit 12a, the number of elements disturbing the pattern of the Ag nanoink was minimized.

In comparative example 2, the Ag nanoink and the Fe nanoink were mixed, thus the viscosity of the ink was changed and thereby the accuracy of discharge was lowered, with the result that as compared with example 3, the resistivity was not satisfactory. In comparative example 3, the alignment of the particles within the pattern of the Ag nanoink first applied by the first patterning unit 12a was disturbed by the Fe nanoink applied later by the second patterning unit 12b, with the result that as compared with example 3, the resistivity was not satisfactory. As described above, in example 3, as compared with comparative examples 2 and 3, satisfactory results of the resistivity and the like were obtained.

TABLE 2

|  | Example 3 | Comparative example 2 | Comparative example 3 |
|---|---|---|---|
| Mixed rate [v %] of particle material Y | 10 | 10 | 10 |
| Timing when particle material Y was mixed | Particle material Y was applied before conductive nanoink X | Simultaneously [previously mixed and then applied] | Conductive nanoink X was applied before particle material Y |
| Burning time [sec] | 3 | 3 | 3 |
| Resistivity [μΩ · cm] | 20 | 40 | 40 |

3. Others

As described above, the conductive pattern production device of each of the embodiments includes the patterning unit that forms the pattern of the composite ink on the base member and the burning unit that burns the pattern by high-frequency heating. The composite ink is obtained by mixing the particle material Y that is a material having a relative permeability of 200 or above or a carbon micro-coil and the conductive nanoink X that has, after burning, a resistivity of 1 to 2000 μΩ·cm.

When a ferromagnetic material is mixed as the particle material Y, the solvent and the dispersion agent of the conductive nanoink X and the like are decomposed not only by heat generated by eddy current loss caused by metal particles but also by heat generated by hysteresis loss actively produced in the ferromagnetic material. When a CMC is mixed as the particle material Y, the solvent and the dispersion agent are likewise decomposed not only by heat generated by eddy current loss caused by metal particles but also by heat generated by eddy current loss, dielectric loss and hysteresis loss produced in the CMC.

With the conductive pattern production device of each of the embodiments, as described above, by enhancing the absorption efficiency in high-frequency heating (increasing the utilized heat generation principle and the effect thereof), it is possible to enhance the energy efficiency of burning by high-frequency heating.

The conductive pattern produced with the conductive pattern production device of each of the embodiments can be utilized in various applications such as the electrode portions of electronic devices such as a printed wiring board, a membrane switch and a display.

What is claimed is:

1. A conductive pattern production device comprising:
   a pattern applicator that forms a pattern of a composite ink on a base member; and
   a burner that burns the pattern by heating,
   wherein the composite ink is obtained by mixing a particle material that is a material having a relative permeability of 200 or above or a carbon micro-coil and a conductive ink that has, after the burning, a resistivity of 1 to 2000 μΩ·cm, and
   wherein the pattern applicator comprises:
   a first pattern applicator that applies one of the particle material and the conductive ink; and
   a second pattern applicator that applies the other of the particle material and the conductive ink.

2. The conductive pattern production device according to claim 1,
   wherein the pattern applicator forms, as the pattern of the composite ink, a pattern in which the particle material and the conductive ink are stacked in layers.

3. The conductive pattern production device according to claim 2,
   wherein the first pattern applicator applies the particle material onto the base member; and
   the second pattern applicator applies the conductive ink onto the applied particle material.

4. The conductive pattern production device according to claim 1, wherein the particle material is a carbon micro-coil.

5. The conductive pattern production device according to claim 1, wherein the particle material is any of Ni, Co, Fe and Gd.

6. The conductive pattern production device according to claim 1, wherein the burner generates electromagnetic waves of 300 MHz to 300 GHz.

7. The conductive pattern production device according to claim 1, wherein the burner is a magnetron, klystron, gyrotron, or microwave heater.

8. The conductive pattern production device according to claim 1, wherein the pattern, applicator comprises anonplate printing head, dispenser, or plate printing head.

9. The conductive pattern production device according to claim 8, wherein the plate printing head is a screen printing, gravure printing or flexographic printing head.

* * * * *